United States Patent [19]
Roth et al.

[11] Patent Number: 5,272,117
[45] Date of Patent: Dec. 21, 1993

[54] METHOD FOR PLANARIZING A LAYER OF MATERIAL

[75] Inventors: Scott S. Roth; Wayne J. Ray; Howard C. Kirsch, all of Austin, Tex.

[73] Assignee: Motorola, Inc., Schaumburg, Ill.

[21] Appl. No.: 986,303

[22] Filed: Dec. 7, 1992

[51] Int. Cl.$^5$ .................................. H01L 21/465
[52] U.S. Cl. .................................. 437/228; 437/195; 437/235; 156/653
[58] Field of Search .............. 437/195, 228; 156/636, 156/635, 643; 257/316

[56] References Cited

U.S. PATENT DOCUMENTS

| | | | |
|---|---|---|---|
| 4,676,868 | 6/1987 | Riley et al. | 156/643 |
| 4,793,895 | 12/1988 | Kaanta et al. | 156/627 |
| 4,944,836 | 7/1990 | Beyer et al. | 156/636 |
| 4,966,865 | 10/1990 | Welch et al. | 437/192 |
| 5,139,962 | 8/1992 | Tanaka | 437/41 |
| 5,160,986 | 11/1992 | Bellezza | 257/316 |

Primary Examiner—Olik Chaudhuri
Assistant Examiner—H. Jey Tsai
Attorney, Agent, or Firm—Keith E. Witek

[57] ABSTRACT

A method for forming a planarized layer of material starts by providing a substrate (12). An integrated circuit layer (14) is formed overlying the substrate (12). A first layer of material (16) is formed overlying the integrated circuit layer (14). An etch stop layer (18) is formed overlying the layer of material (16) and etched to form sidewall formations or spacers. A second layer of material (20) is formed overlying the layer of material (16) and the etch stop layer (18). Planarization, polishing, or etch-back processing is performed using the etch stop layer (18) to endpoint. The resulting planarized layer has a thickness which is determined accurately by the etch stop layer (18).

21 Claims, 4 Drawing Sheets

METHOD FOR PLANARIZING A LAYER OF MATERIAL

FIELD OF THE INVENTION

The present invention relates generally to semiconductor technology, and more particularly, to planarization of a layer of integrated circuit material.

BACKGROUND OF THE INVENTION

Conventional integrated circuits are becoming increasingly complex. Today, an integrated circuit may be formed having multiple layers of conductive material or interconnect layers. The use of multiple layers of conductive materials or interconnect layers results in an integrated circuit which has an extremely nonplanar topography. Non-planar surfaces in integrated circuits are known to cause difficulties such as voids in dielectric materials, photolithography resolution problems due to depth of focus, etch damage due to varying film thicknesses and film heights, and reduced yield.

To avoid these difficulties, planarization of integrated circuit layers is now becoming essential to ensure a high performance, high yield integrated circuit. One method for planarizing a surface involves first forming a layer of material which requires planarization. A planar layer of photoresist material is spun overlying the layer of material. An etch chemistry is selected which etches the layer of material and the planar layer of photoresist at approximately the same rate. This etch chemistry is used to etch the planar surface of the photoresist layer into the layer of material thereby planarizing the layer of material.

The etch chemistry used to etch the layer of material and the planar layer of photoresist at approximately the same rate is difficult to control and monitor. In most cases, process variation, film thickness variation, differences in film composition, contamination, and other phenomena result in the etch rates not being equal. If the etch rates are not equal, the surface is not as planar as desired. In addition, there is no way in which to consistently endpoint this method of planarization.

In most cases, a timed etch/planarization process is utilized for the above described process due to the fact that the above described process is not able to accurately endpoint. A timed etch/planarization process planarizes the layer of material and the planar layer of photoresist for a predetermined amount of time. Timed etches/planarizations are subject to under-etching and over-etching. If the layer of material is over-etched, then conductive layers which are underlying the layer of material could be exposed through the layer of material resulting in undesirable electrical short circuits. If the layer of material is under-etched, then the layer of material may remain unplanarized, or may remain too thick. Subsequent electrical contact etch processing may not completely remove portions of the layer of material resulting in electrical contacts being formed as undesirable electrical open circuits.

Another method which is used to planarize is known as chemical mechanical polishing (CMP). CMP involves forming a layer of material over a substrate. A planar pad, rotating from roughly ten to thousands of rotations/360° revolutions per minute (RPM), is applied to the wafer. The wafer exerts a force on the layer of material and grinds the layer of material to a planar or near-planar surface. In some cases a chemical/liquid polishing compound, known in the art as a slurry, is placed between the planar pad and the layer of material to aid in the planarization. In most cases the slurry contains suspended solid particles which are used for furthering the polishing process.

CMP, much like chemical etch planarization, is difficult to endpoint. Therefore in most cases, CMP is time-based like a timed etch. Therefore, CMP, as currently practiced in the art, is subject to all of the disadvantages recited above in regard to timed etching.

In some cases, an etch stop layer is covered over the entire layer of material to help in endpointing the CMP process. The etch stop material is a material which planarizes much slower than the layer of material. Therefore, once the etch stop material is in contact with the planar pad used for polishing, polishing is slowed significantly and end-pointing may take place with reduced over-etching and under-etching.

By using an etch stop layer which covers the entire layer of material, the etch stop layer needs to be etched in order to form through-holes, contacts, vias or the like. The etching of many known etch stop layers, such as $Al_2O_3$ and boron nitride, requires complex and difficult processing or multi-step etch processing, and may result in profile damage to contacts. In addition, the etch stop layer becomes a part of the layer of material and alters a thickness of the layer of material and the dielectric constant of the layer of material. Furthermore, if the etch stop layer is conductive, special processing is required in order to avoid the electrical short circuiting of contacts and the like.

SUMMARY OF THE INVENTION

The previously mentioned disadvantages are overcome and other advantages achieved with the present invention. In one form, the present invention comprises a method for planarizing a layer of material. The method begins by providing a substrate. A first portion of the layer of material is formed overlying the substrate. The first portion of the layer of material has both a surface and a surface topography which is non-planar. The surface topography defines at least one sidewall of the first portion of the layer of material. An etch stop material is formed adjacent the at least one sidewall. The etch stop material exposes the surface of the first portion of the layer of material. A second portion of the layer of material is formed overlying both the first portion of the layer of material and the etch stop material. The second portion of the layer of material has a surface topography which is non-planar. The layer of material is planarized using the etch stop material to indicate when in time the step of planarizing is to complete.

The present invention will be more clearly understood from the detailed description below in conjunction with the accompanying drawings.

DESCRIPTION OF A PREFERRED EMBODIMENT

Figure 1:
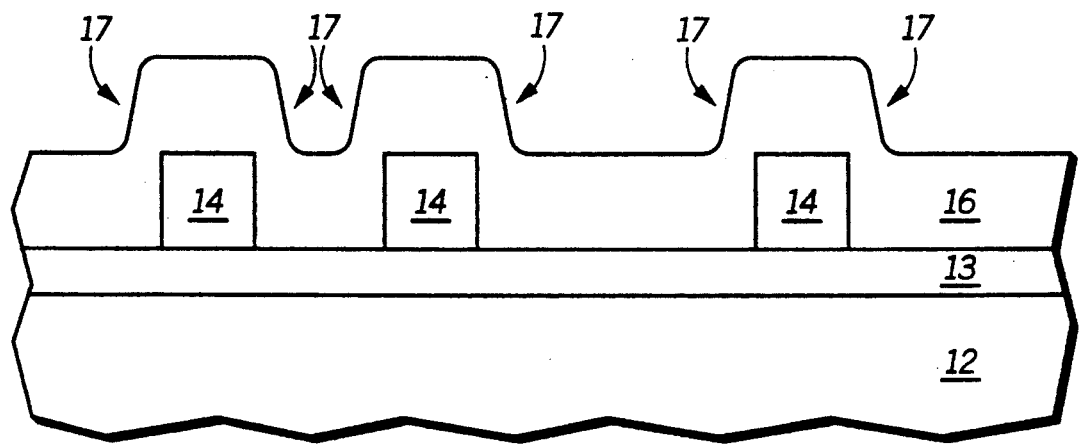
FIGS. 1–6 illustrate, in cross-sectional form, a method for forming a planarized layer of material in accordance with the present invention.

Illustrated in FIG. 1 is a semiconductor structure. A substrate 12 is illustrated. Substrate 12 may be made of silicon, gallium arsenide, silicon on sapphire (SOS), epitaxial formations, germanium, germanium silicon, diamond, silicon on insulator (SOI) material, and/or like substrate materials. Preferably, the substrate 12 is made of silicon. A device layer 13 is formed overlying the substrate 12. The device layer 13 may be a single layer, such as a gate oxide or a field oxide, or may be a plurality of vertically stacked layers such as polysilicon gates, oxides, interconnects, inter-level dielectrics, isolation formations, active devices, passive devices, and/or the like. Device layer 13 is intended to illustrate that the planarization methods taught herein may be performed at any level within an integrated circuit.

Integrated circuit regions 14 are formed on the surface of the device layer 13. Integrated circuit regions 14 are typically conductive layers such as polysilicon, amorphous silicon, a semiconductive material, epitaxial silicon, metal, silicides, salicides, or like conductors. The integrated circuit regions 14 form an integrated circuit surface which has a non-planar surface topography. A non-planar surface topography is any topography which is not completely planar, but instead has some "hills" and "valleys."

A layer of material 16 is formed overlying the device layer 13 and the integrated circuit regions 14 as illustrated in FIG. 1. Due to the non-planar surface topography defined by integrated circuit regions 14, the layer of material 16 is formed having a surface and a surface topography which is non-planar. Therefore, a first portion of the layer of material 16 has a first height above the surface of the substrate 12, and a second portion of the layer of material 16 has a second height above the substrate material. The first height is greater than the second height. The non-planar surface topography defines sidewalls 17 as illustrated. In a preferred form, layer of material 16 is a dielectric material known as an inter-layer dielectric. In other embodiments the layer of material may be a conductive or semiconductive layer.

If the layer of material 16 is a dielectric material, the dielectric material may vary in physical and chemical composition based upon the application. The dielectric layers described herein may be wet or dry silicon dioxide ($SiO_2$), a nitride material, tetraethyl-ortho-silicate (TEOS) based oxides, boro-phosphate-silicate-glass (BPSG), phosphate-silicate-glass (PSG), boro-silicate-glass (BSG), oxide-nitride-oxide (ONO), tantalum pentoxide ($Ta_2O_5$), plasma enhanced silicon nitride (P-$SiN_x$), titanium oxide, oxynitride, and/or like dielectric materials. Specific dielectrics are noted herein when a specific dielectric material is preferred or required.

Figure 2:
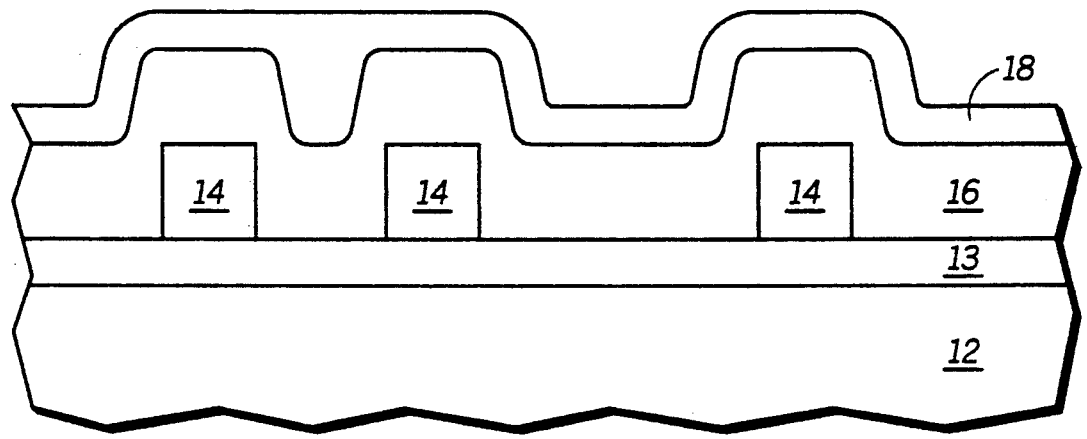

In FIG. 2, an etch stop layer 18 is formed overlying the layer of material 16. The etch stop layer 18 may be any layer which polishes/etches at a slower rate than the material which requires planarization (i.e. layer of material 16). Some examples of an etch stop layer 16 used for etch stopping an oxide material are silicon nitride, polysilicon, $Al_2O_3$, carbon, diamond, boron nitride, boron oxynitride, tungsten, tantalum oxide, and like etch stop layers. Nitride is a preferred etch stop material due to the fact that its etching properties and etch chemistries are similar to oxides and are well developed in the art.

Figure 3:
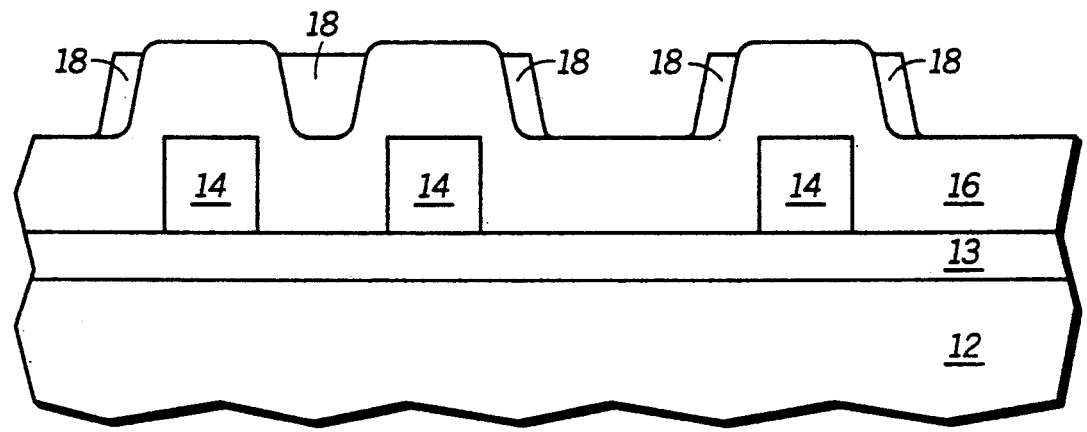

In FIG. 3, a spacer etch process, a reactive ion etch (RIE) step, or a like process is used to form sidewall material or spacers from the etch stop layer 18. The spacers formed from the etch stop layer 18 may be formed with a lateral width anywhere from roughly 30 nm to 300 nm. The etch stop layer 18 therefore remains only adjacent the sidewalls 17 which were illustrated in FIG. 1. A top portion of each of the spacers of the etch stop layer 18 is approximately the same height as the highest level of the layer of material 16.

Figure 4:
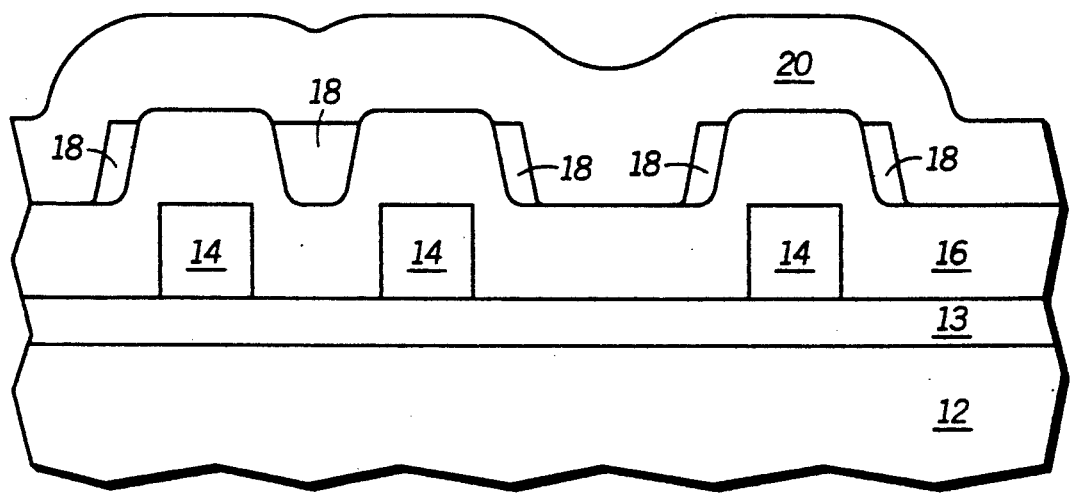

In FIG. 4, a layer of material 20 is formed overlying the layer of material 16 and the etch stop layer 18. The layer of material 20 is preferably the same material as the layer of material 16 but may be a different material in some applications. For example, layer of material 16 may be a TEOS-based oxide whereas layer of material 20 is BPSG. The layer of material 20 has a surface topography similar to the surface topography of the layer of material 16 (i.e. non-planar).

Figure 5:
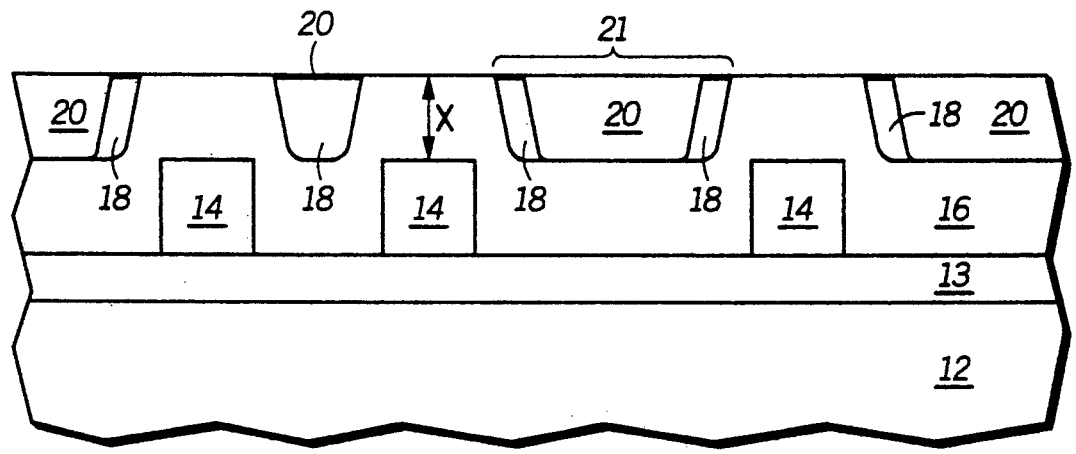

In FIG. 5, a planarization step is used to remove upper portions of the layer of material 20. Once the layer of material 20 is planarized to a point in time wherein the etch stop layer 18 is exposed, the planarization process terminates or endpoints. The resulting layer of material formed via layers of material 16 and 20 and etch stop layer 18 is a planar layer of material. The planar layer of material may be conductive, semiconductive, dielectric or a combination of these in composition.

There are several ways to perform the planarization process, and several ways in which to use the etch stop layer 18 to endpoint. One method for planarization involves using chemical/mechanical polishing (CMP). CMP involves placing the wafer on a vacuum plate and holding it secure. A planar polishing pad is positioned adjacent a surface of the wafer which contains integrated circuits. Either the planar polishing pad is rotated with respect to the wafer, the wafer is rotated with respect to the pad, or both are rotated. The planar polishing pad is brought into contact with the wafer while rotation is occurring. The planar surface of the planar polishing pad grinds high points out of the integrated circuits and makes the surfaces of the integrated circuits more planar. In most cases, a slurry or polishing liquid/chemical is positioned between the wafer and the planar polishing pad. The slurry is used to aid in polishing.

The spacers formed from etch stop layer 18 polish at a rate which is much slower than the polish rate of the layers 16 and 20. Therefore, once a slower rate of polishing (i.e. the downward motion of the planar polishing pad slows) the process is complete and endpointing can occur. Pressure can also be used to sense when the etch stop layer 18 is being polished versus when the layers 16 and 20. More pad pressure will be needed to polish at a constant rate once the etch stop layer 18 is exposed by the planar polishing pad. In another form, the slurry will indicate when the planar polishing pad has exposed the etch stop layer 18. The slurry initially will contain residue and particles from only layer of material 20 due to the fact that the layer of material 20 is the only material being polished. Once the etch stop layer 18 is exposed and begins to be polished, residue and particles will be detectable in the slurry that were not previously present during polishing of only the layer of material 20. This slurry detection mechanism will ensure that the polishing/planarization process endpoints when the etch stop layer 18 is exposed by the planar polishing pad. In general, polishing of a layer of material using chemical/mechanical polishing (CMP) with a slurry may be endpointed by detecting a chemical change within the slurry caused by the etch stop layer. The detection of the change in the slurry is used to endpoint the polishing.

The method taught above in reference to FIG. 1-5 has various advantages. The etch stop material for conventional planarization processing covers the entire wafer. Therefore, the etch stop material is present in regions where electrical contacts and vias are formed. If the etch stop is difficult to etch, etches differently than the layers of material 16 and 20, or is conductive, then forming vias and contact becomes a more difficult process that has the possibility of lower yields.

In FIG. 5, the etch stop layer is removed from the contact regions and remains only on sidewall areas. Therefore, vias and contacts easily formed and are formed with greater consistency and yield. Furthermore, the thickness of the spacers formed by etch stop layer 18 may be designed between roughly 30 nm and 300 nm as desired in order to avoid affecting electrical contacts and the like. In another form the etch stop layer 18 may be used as an etch stop layer to form a self-aligned contact between features formed by integrated circuit layer 14. For example, the etch stop layer 18 may be used in region 21 of FIG. 5 to ensure that a contact is self-aligned and does not electrically short circuit to regions formed by integrated circuit layer 14.

Furthermore, deposition of the layer of material 16 can be accurately controlled in the art to roughly 0.5% across-wafer deviation or better. Therefore the thickness X in FIG. 5 is relatively close to a desired thickness. By forming the etch stop layer as illustrated in FIG. 5: (1) the etch stop layer does not contribute to the final thickness of the polished layer of material; and (2) the etch stop ensures that the polished layer of material has a minimum insulative thickness which either is exactly equal to or nearly equal to the thickness X (i.e. the 0.5% deviation deposition thickness of layer of material 16). This type of polishing thickness control, self-aligned contact formation, via and contact improvement, and endpoint capability is not achieved in other time-based polishing techniques or time etching techniques.

Instead of using CMP, a chemical etching technique may be used in FIG. 5. A layer of photoresist (not illustrated) or alike material may be formed in a planar manner over the surface of the layer of material 20. A reactive ion etch (RIE) or like etch step is used to remove the photoresist at a same rate of removal as the layer of material 20. The planar surface of the layer of photoresist (not illustrated) is transferred or etched into the layer of material 20. A monochrometer or a like endpoint/etch detection device may be used to detect when the etch stop layer 18 is exposed by the RIE etch processing. Once the etch stop layer is exposed and detected, the planarization process is terminated. In general, polishing of a layer of material using a chemical etch-back process may be endpointed by detecting an emission change within the ambient environment. The change in the ambient environment is caused by the etch stop layer. The detection the change is used to endpoint the chemical etch-back process. The results and advantages between the CMP process and this etch-back process are similar.

Figure 6:
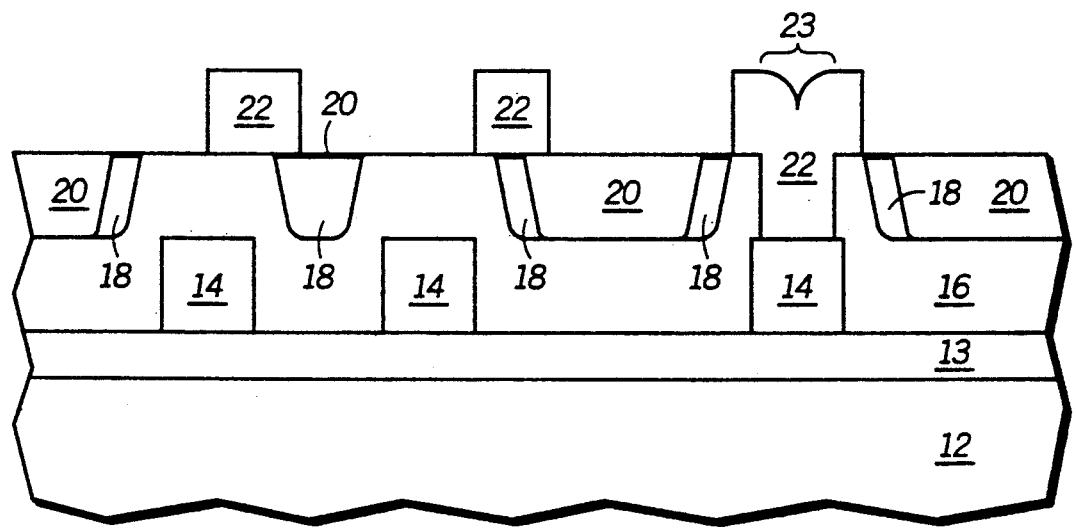

In FIG. 6, the polished layer of material made via layers 16, 18, and 20 is used as an inter-layer dielectric. The integrated circuit layer 14 is formed as conductive gate electrodes or a like conductive layer/interconnect and layer 22 is formed as a second conductive layer or interconnect structure. Openings, vias, or contacts 23 are formed through the polished layer of material to form electrical contact regions.

Figure 7:
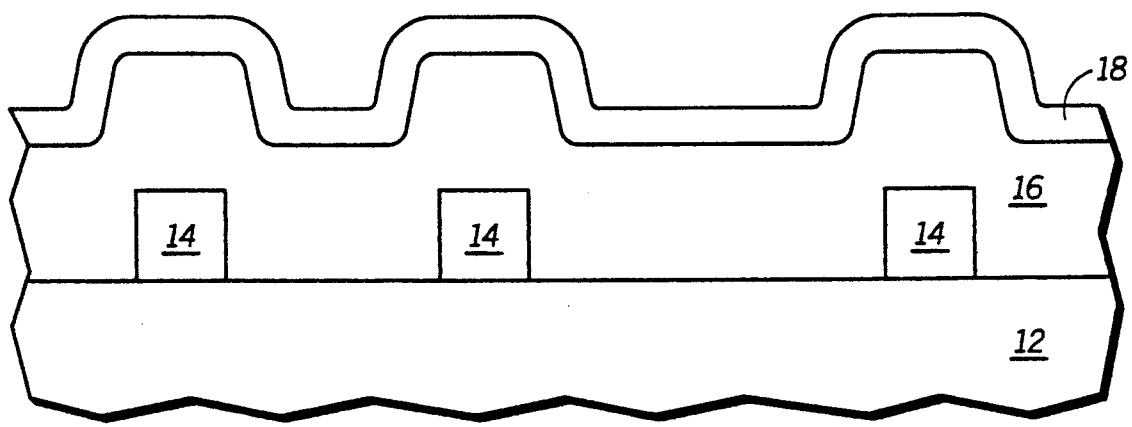
FIGS. 7–11 illustrate, in cross-sectional form, another method for forming a planarized layer of material in accordance with the present invention.

FIGS. 7-11 illustrate another method which may be used to form a planarized/polished layer of material. In FIG. 7, the substrate 12, the integrated circuit layer 14, the layer of material 16, and the etch stop layer 18 are illustrated.

Figure 8:
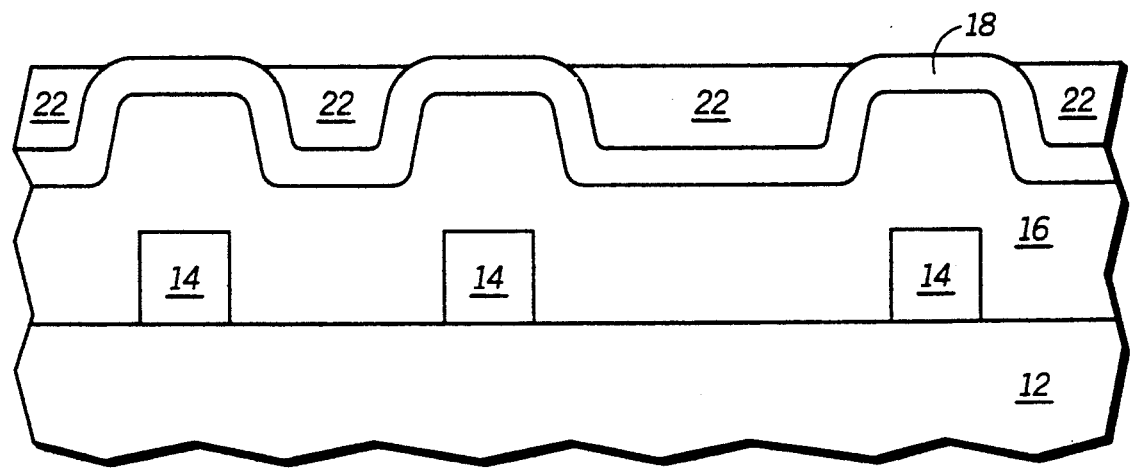

In FIG. 8, a masking layer or planar layer 22 is formed over the etch stop layer 18. The planar layer 22 may be a spin on glass, a polished layer of material, a photoresist layer, a layer of material that has been etched-back or the like. The planar layer 22 exposes top portions of the etch stop layer 18.

In one form, the structure of FIG. 8 may be RIE etched using a chemistry that etches layers 16, 18, and 22 at an equal rate. This RIE etching will form a planarized surface from layers 18 and 16. This RIE etching technique is a technique which is referred to as the end layer option.

Figure 9:
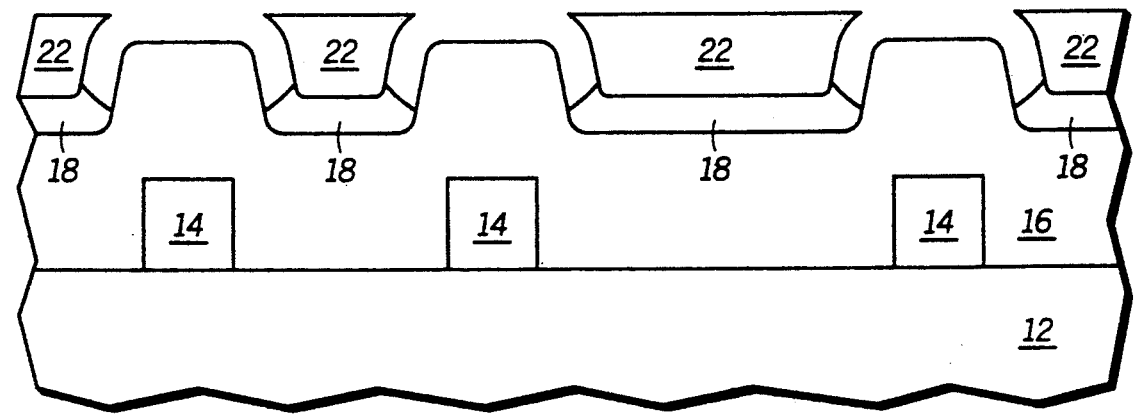

In FIG. 9, the top portions of the etch stop layer 18 which are exposed by the planar layer 22 are etched using an isotropic chemistry or a like etch process. The isotropic etch removes the exposed portions of the etch stop layer 22 but leaves behind portions of the etch stop layer over low portions of the layer of material 16 as illustrated.

In another form, the planar layer 22 is made of a reflow glass such as BPSG. PSG and/or the like. The reflow of a reflow glass is usually heavily dependent upon surface tension. Due to the fact that the planar layer 22 in FIG. 9 is almost entirely free-floating, the planar layer 22 will reflow at a very low temperature (i.e. approximately 650° C.). This reflow process will re-planarize planar layer 22 and result in improved planarization results.

Figure 11:
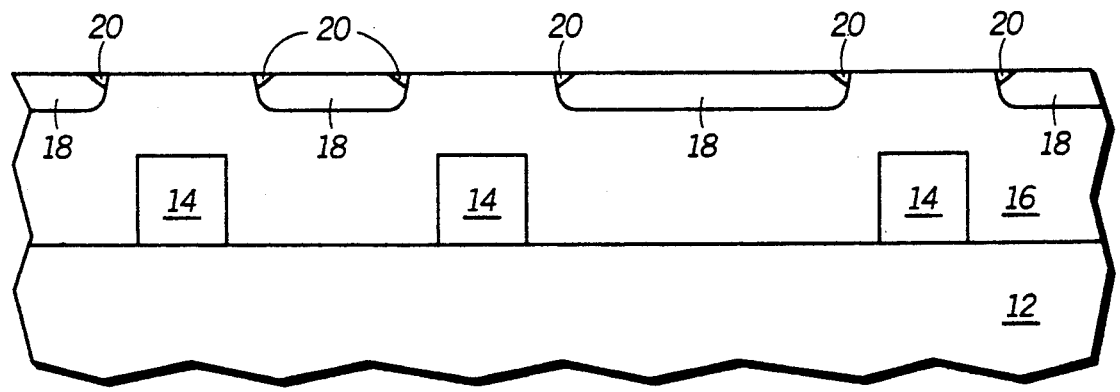

The structure illustrated in FIG. 9 may now be polished via CMP or etch-back techniques to form a completed structure which is illustrated in FIG. 11. The etch stop layer 18 functions as an etch stop similar to the etch stop layer 18 of FIG. 5.

Figure 10:
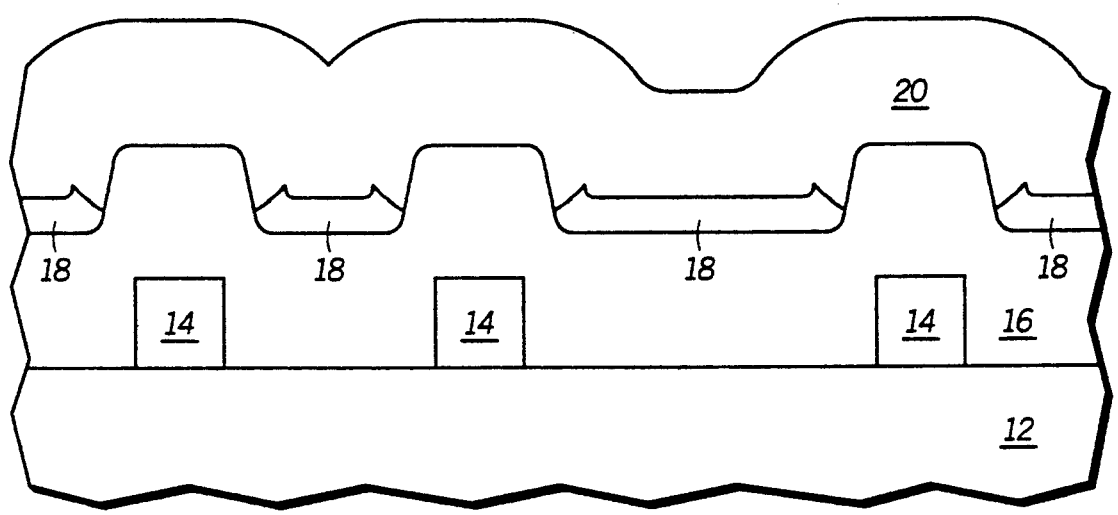

In yet another form illustrated in FIG. 10, the planar layer 22 may be removed and the layer of material 20 may be formed overlying the etch stop layer 18 and the layer of material 16. The layer of material 20 is then polished as in FIGS. 4-5 to form the polished structure of FIG. 11. Once again, endpointing and the dielectric thickness of the polished layer are controlled in a very accurate manner as described above. The planarized dielectric of FIG. 11 may also be used as an inter-level dielectric having contact and/or vias as illustrated in FIG. 6.

While the present invention has been illustrated and described with reference to specific embodiments, further modifications and improvements will occur to those skilled in the art. For example, many etch stop materials exist and all may be used in the embodiment taught herein. Many forms of CMP, planarization, and etch-back procedures exist and may be used with the process taught herein. The planarized dielectric layer may be used in many applications, such as trench isolation filling, interlevel dielectric layers, and the like. The etch stop layers taught herein may be used to endpoint in one of many known manners. In some embodiments, the etch stop layers taught herein may be etched, completely removed, or oxidized after being used to endpoint. It is to be understood, therefore, that this invention is not limited to the particular forms illustrated and that it is intended in the appended claims to cover all modifications that do not depart from the spirit and scope of this invention.

We claim:

1. A method for planarizing a layer of material comprising the steps of:
   providing a substrate;
   forming a first portion of the layer of material overlying the substrate, the first portion of the layer of material having a surface and a surface topography which is non-planar, the surface topography defining at least one sidewall of the first portion of the layer of material;
   forming an etch stop material adjacent the at least one sidewall, the etch stop material exposing the surface of the first portion of the layer of material;
   forming a second portion of the layer of material overlying both the first potion of the layer of material and the etch stop material, the second portion of the layer of material having a surface topography which is non-planar, the etch stop material being made of a material which is different from the material used to form the second portion of the layer of material; and
   planarizing the layer of material wherein the second portion of the layer of material planarizes at a first rate and the etch stop material planarizes at a second rate which is less than the first rate, the etch stop material being used to indicate when in time the step of planarizing is to complete.

2. The method of claim 1 wherein the step of planarizing comprises planarizing using a process selected from a group consisting of: chemical/mechanical polishing (CMP) and chemical etching.

3. The method of claim 1 wherein the step of forming an etch stop material comprises forming the etch stop material as a material which is chemical/mechanical polished at a slower rate than the second portion of the layer of material.

4. The method of claim 1 wherein the layer of material is formed as an oxide material and the etch stop material is formed as a nitride material.

5. The method of claim 1 wherein the step of planarizing comprises the steps of:
   polishing the layer of material using chemical/mechanical polishing (CMP) with a slurry; and
   detecting a chemical change within the slurry caused by the etch stop layer, the detecting being used to endpoint the step of polishing.

6. The method of claim 1 wherein the step of planarizing is performed in an ambient environment and comprises the steps of:
   polishing the layer of material using a chemical-etchback process; and
   detecting an emission change within the ambient environment caused by the etch stop layer, the detecting being used to endpoint the step of polishing.

7. The method of claim 1 further comprising the steps of:
   forming a first conductive layer underlying the layer of material; and
   forming a second conductive layer overlying the layer of material.

8. The method of claim 1 further comprising the steps of:
   forming a conductive layer underlying the layer of material; and
   forming an opening through the layer of material to form an electrical contact to the conductive layer.

9. The method of claim 1 further comprising the step of:
   removing the etch stop layer after the step of planarizing is complete.

10. A method for forming a planarized layer of material overlying a surface of a substrate material, the method comprising the steps of:
    forming a first layer of material, the first layer of material having a first portion which is a first height above the surface of the substrate material and having a second portion which is a second height above the surface of the substrate material wherein the second height is greater than the first height, a third portion of the first layer of material defining a sidewall of the first layer of material;
    forming a sidewall material adjacent the sidewall of the first layer of material, the sidewall material exposing a portion of the first layer of material;
    forming a second layer of material overlying the first layer of material, the second layer of material being made from a first material which is different from a second material used to form the sidewall material; and
    forming the planarized layer of material from the first layer of material and the second layer of material by using the sidewall material as an etch stop material, the second layer of material planarizing at a rate which is greater than a planarization rate of the sidewall material.

11. The method of claim 10 wherein the step of forming the planarized layer of material comprises planarizing using a process selected from a group consisting of: chemical/mechanical polishing (CMP) and chemical etching.

12. The method of claim 10 wherein the step of forming the first layer of material comprises forming the first layer of material from the first material.

13. The method of claim 10 wherein the step of forming the planarized layer of material comprises the steps of:
    polishing the layer of material using chemical/mechanical polishing (CMP) with a slurry; and
    detecting a chemical change within the slurry brought upon by the etch stop layer, the detecting being used to endpoint the step of polishing.

14. The method of claim 10 wherein the step of forming the planarized layer of material is performed in an ambient environment and comprises the steps of:
    polishing the layer of material using a chemical etchback process; and
    detecting an emission change within the ambient environment brought upon by the etch stop layer, the detecting being used to endpoint the step of polishing.

15. The method of claim 10 further comprising the steps of:
    forming a first conductive layer underlying the layer of material; and
    forming a second conductive layer overlying the layer of material.

16. A method for forming a planarized layer of material comprising the steps of:
    providing a substrate;
    forming a first layer of material overlying the substrate, the first layer of material having a topography which is non-planar and which has high surfaces and low surfaces relative to the substrate;

forming an etch stop layer overlying the first layer of material;

forming a masking layer over the etch stop layer, the masking layer exposing portions of the etch stop layer overlying said high surfaces to form exposed etch stop portions;

removing the exposed etch stop portions, the step of removing resulting in portions of the etch stop layer remaining overlying said low surfaces; and planarizing the first layer of material using the portions of the etch stop layer remaining overlying said low surfaces to indicate when the step of planarizing is to complete.

17. The method of claim 16 further comprising the step of:

removing the masking layer before performing the step of planarizing.

18. The method of claim 17 further comprising the step of:

forming a second layer of material overlying the first layer of material and overlying the portions of the etch stop layer remaining overlying said low surfaces, the second layer of material being formed before performing the step of planarizing.

19. The method of claim 16 further comprising the steps of:

forming a first conductive layer underlying the first layer of material; and forming a second conductive layer overlying the first layer of material.

20. The method of claim 16 further comprising the steps of:

forming a conductive layer underlying the first layer of material; and forming an opening through the first layer of material to form an electrical contact to the conductive layer.

21. The method of claim 16 further comprising the step of:

heating the masking layer to a temperature wherein reflow of the masking layer occurs.

* * * * *